United States Patent [19]

Watanabe

[11] 4,196,003

[45] Apr. 1, 1980

[54] LIGHT-SENSITIVE O-QUINONE DIAZIDE COPYING COMPOSITION

[75] Inventor: Masaru Watanabe, Shizuoka, Japan

[73] Assignee: Fuji Photo Film Co., Ltd., Minami-ashigara, Japan

[21] Appl. No.: 765,036

[22] Filed: Feb. 2, 1977

Related U.S. Application Data

[63] Continuation of Ser. No. 546,482, Feb. 3, 1975, abandoned.

[30] Foreign Application Priority Data

Feb. 1, 1974 [JP] Japan ................................. 49-13465

[51] Int. Cl.$^2$ ........................ G03C 1/60; G03C 1/54
[52] U.S. Cl. .................................. 430/193; 430/145; 430/300; 430/310; 430/149; 430/154; 430/220
[58] Field of Search ........... 96/91 D, 75, 86 P, 115 R, 96/49, 33, 36

[56] References Cited

U.S. PATENT DOCUMENTS

| | | | |
|---|---|---|---|
| 1,967,371 | 7/1934 | Schmidt et al. | 96/91 D |
| 2,702,243 | 2/1955 | Schmidt | 96/91 D |
| 2,994,609 | 8/1961 | Landau | 96/49 |
| 3,106,465 | 10/1963 | Neugebauer et al. | 96/91 D |
| 3,126,281 | 3/1964 | Sus et al. | 96/91 D |
| 3,231,382 | 1/1966 | Silver | 96/75 |
| 3,264,104 | 8/1966 | Reichel | 96/91 D |
| 3,402,044 | 9/1968 | Steinhoff et al. | 96/91 D |
| 3,592,646 | 7/1971 | Holstead et al. | 96/91 D |
| 3,661,582 | 5/1972 | Broyde | 96/91 D |
| 3,759,711 | 9/1973 | Rauner et al. | 96/91 D |
| 3,779,774 | 12/1973 | Cope et al. | 96/91 D |
| 3,890,152 | 6/1975 | Ruckert et al. | 96/91 D |
| 4,007,047 | 2/1977 | Kaplan et al. | 96/91 D |

OTHER PUBLICATIONS

March, J., "Advanced Organic Chemistry: Reactions, Mechanisms and Structure," (pp. 334–377 cited).
Morrison et al., "Organic Chemistry," 2nd ed., 1966, (p. 719 cited).
Dinaburg, M. S., "Photosensitive Diazo Compounds," The Focal Press, 1964, pp. 31–46 and 181–196.
Noller, C. R., "Chemistry of Organic Compounds," 3rd ed. W. B. Saunders Co., 1965, pp. 259–260.
Roberts, J. D., et al., "Basic Principles of Organic Chemistry," 1965, pp. 563, 664 and 665.

*Primary Examiner*—Charles L. Bowers, Jr.
*Attorney, Agent, or Firm*—Sughrue, Rothwell, Mion, Zinn and Macpeak

[57] ABSTRACT

A light-sensitive copying layer containing an o-quinone-diazide compound and at least one of a secondary amine and a tertiary amine.

5 Claims, No Drawings

LIGHT-SENSITIVE O-QUINONE DIAZIDE COPYING COMPOSITION

This is a continuation of application Ser. No. 546,482, filed Feb. 3, 1975, now abandoned.

BACKGROUND OF THE INVENTION

1. Field of the Invention

The present invention relates to a light-sensitive copying layer containing an o-quinonediazide compound as a light-sensitive ingredient and, more particularly, to a light-sensitive copying layer which enables both positive-positive type copying for obtaining a positive image from a positive original and negative-positive type copying for obtaining a positive image from a negative original to be conducted.

2. Description of the Prior Art

As is well known, o-quinonediazide compounds are light-sensitive substances and are used as a light-sensitive component in a light-sensitive copying layer used for a light-sensitive printing plate, an original for projecting a photoetching resist, and the like.

It has been demonstrated that the o-quinonediazide compounds undergo decomposition of the diazo group upon irradiation with active light to produce a compound having a carboxy group. Therefore, when a copying layer containing such a o-quinonediazide compound is development-processed with an alkaline developer after imagewise exposure, the exposed areas are removed from the support while the unexposed areas form an image. Thus, the so-called positive-positive type image formation is effected.

On the other hand, a negative-positive type light-sensitive copying layer containing both an o-quinonediazide compound and a solid compound containing a free primary amino group has also been found, with which the exposed areas of the layer become insoluble while the unexposed areas are removed to form an image at the exposed areas.

However, a process for effecting both positive-positive type and negative-positive type image formation using light-sensitive copying materials having the same light-sensitive copying layer containing an o-quinonediazide compound have not been found.

SUMMARY OF THE INVENTION

As a result of various investigations on a process for effecting negative-positive type image formation using an o-quinonediazide-containing copying layer which essentially enables positive-positive image formation to be conducted, the present invention has been achieved.

That is, an object of the present invention is to provide a light-sensitive copying layer which enables both positive-positive type and negative-positive type image formations to to be conducted.

It has now been discovered that the above-described object can be attained with a light-sensitive copying layer containing an o-quinonediazide compound and at least one of a secondary amine and a tertiary amine.

DETAILED DESCRIPTION OF THE INVENTION

When the light-sensitive copying layer is development-processed with an alkaline developer after being imagewise exposed with active light, the exposed areas are removed to effect positive-positive type image copying. On the other hand, when the light-sensitive copying layer is imagewise exposed with active light and, after heating the layer simultaneously with or after the imagewise exposure, the unexposed areas or all of areas are irradiated with active light and the material is development-processed with an alkaline developer, the unexposed areas in the first imagewise exposure are removed to effect negative-positive type image copying.

That is, the light-sensitive copying layer of the present invention has the property that, when heat-treated simultaneously with or after imagewise exposure, the alkali solubility which has been generated is again eliminated, as well as the property of being rendered alkali-soluble upon exposure to active light, this latter property being essential to the o-quinonediazide light-sensitive layer. This property has not so-far been discovered at all.

o-Quinonediazide compounds which can be used in the present invention are compounds which have at least one o-quinonediazide group and which undergo an increase in solubility in an alkali solution upon irradiation with active light. As such compounds, known compounds with various structures are described in detail in, e.g., J. Kosar; Light-Sensitive Systems, John Wiley & Sons, Inc. Further, examples of o-quinonediazide sulfonic acid esters are described in U.S. Pat. Nos. 3,046,118, 3,046,119, and 3,046,121, and examples of o-quinonediazide sulfonamides are described in U.S. Pat. Nos. 3,046,122 and 3,046,123. In particular, various hydroxy compounds and o-benzo-or o-naphthoquinonediazide sulfonic acid esters are suitable. Typical examples include: 2,2'-dihydroxy-diphenyl-bis(-naphthoquinone-1,2-diazido-5-sulfonate), 2,2',4,4'-tetrahydroxydiphenyl-tetra(naphthoquinone-1,2-diazido-5-sulfonate), 2,3,4,-trihydroxybenzophenone-bis(naphthoquinone-1,2-diazido-5-sulfonate), and the like. In particular, polyhydroxyphenyl naphthoquinone-1,2-diazido-5-sulfonic acid ester described in U.S. Pat. No. 3,635,709 and obtained by the polycondensation of acetone and pyrogallol is usable with advantage.

The secondary and tertiary amines which can be used in the present invention are those which possess a boiling point of not less than about 200° C. For example, typical examples include aliphatic amines (e.g., tributylamine, triamylamine, etc.), amines which have a hydroxy group or groups (e.g., diethanolamine, N-methylethanolamine, N-methyldiethanolamine, dipropanolamine, triethanolamine, etc.), aromatic amines (e.g., diethylaniline, etc.), and cyclic amines (e.g., hexamethylenetetramine, etc.).

As to the ratio of the o-quinonediazide compound to the secondary or tertiary amine, about 0.005 to 1 part by weight, particularly 0.01 to 0.3 part by weight, of the amine per part by weight of the o-quinonediazide compound is suitable.

To the light-sensitive copying layer of the present invention can be added various additives in addition to the above-described ingredients. For example, in order to render the images distinct, pigments such as Phthalocyanine Blue or various dyes such as Malachite Green, Safranine, etc. can be added. Also, in order to increase the strength of images or as a binder, resins uniformly miscible with the aforesaid ingredients such as a phenol-formaldehyde resin, a cresol-formaldehyde resin, a styrene-maleic anhydride copolymer, methacrylic acid-methyl methacrylate copolymer, etc. can be added thereto.

The light-sensitive composition having the above-described ingredients is coated on a suitable support such as a metal plate (e.g., an aluminum plate, a zinc plate, etc.), paper, plastic-laminated paper (e.g., polyethylene-laminated paper, polystyrene-laminated paper, etc.), a plastic film (e.g., a polyethylene terephthalate film, a cellulose diacetate film, a cellulose triacetate film, a nitrocellulose film, a polycarbonate film, a polyvinyl chloride film, etc.) to prepare a light-sensitive copying material. A suitable coating amount of the o-quinonediazide can range from about 0.1 to 5 g/m² of the support on a dry basis.

Such a light-sensitive copying material is imagewise exposed with active light in a conventional manner. Suitable light sources for the active light include, a xenon lamp, a carbon arc lamp, a mercury lamp, a fluorescent lamp, etc. A suitable exposure time generally ranges from about 30 seconds to about 5 minutes, although this depends on the intensity of the light source.

In the case of conducting positive-positive type image copying, development processing is conducted after imagewise exposure.

Where negative-positive type image copying is conducted, a heat-treatment is involved. Heat-treatment accelerates the insolubilization of areas having been exposed upon imagewise exposure. Heating can be effected either simultaneously with or after the imagewise exposure. The heating temperature is at least about 30° C. and, in particular, a temperature of 70 to 200° C. is preferred.

When the heating temperature ranges from about 30° C. to 70° C., the heat-treatment requires a comparatively long period of time while, when the temperature exceeds 200° C., light sensitivity at the unexposed areas decreases. Therefore, the heat treatment is preferably conducted employing the preferred heating temperature range considering processing time and sensitivity. As to the heating means, various means such as placing a light-sensitive copying material in a heated atmosphere, immersing the material in a heated liquid, contacting the material with a heated solid, and the like can be employed.

The heat-treated light-sensitive copying material is then irradiated with active light. This irradiation processing is conducted so that the light-sensitive layer at areas unexposed in the preceding imagewise exposure can be removed by the development processing conducted subsequently. Therefore, at least those areas unexposed in the above-described imagewise exposure must be irradiated with active light. However, since the light-sensitive layer at areas exposed in the preceding imagewise exposure are no longer light sensitive, no change upon irradiation with active light occurs at this stage. Therefore, from the viewpoint of working efficiency, it is advantageous to irradiate all of the light-sensitive layer with active light.

Upon development-processing after the above-described processings, areas unexposed in the preceding imagewise exposure are dissolved away. The developer which can be used in the development processing can be selected from among many known developers which have so far been used for positive-positive type image formation using an o-quinonediazide compound. That is, development can be effected with ease by immersion in or washing with an alkaline aqueous solution, preferably having a pH of 11 or higher. As the alkaline solution, an aqueous solution containing sodium hydroxide, potassium hydroxide, sodium silicate, potassium silicate, sodium tertiary phosphate, potassium tertiary phosphate, sodium carbonate, potassium carbonate or a basic solvent (e.g., ethanolamine), are illustrative. In some cases, an organic solvent, a surface active agent and the like can be additionally incorporated. Suitable surface active agents which can be employed in this invention are anionic surface active agents or amphoteric surface active agents well known as a detergent agent, a dyeing assistant, a wetting agent, an emulsifying agent and/or an antistatic agent and soluble in an alkaline solution. Examples of anionic surface active agents are e.g., sodium alkylbenzenesulfonates, sodium alkylnaphthalenesulfonates, sodium naphthalenesulfonateformaldehyde condensation products, sodium dialkylsulfosuccinates and sodium dialkylamidesulfonates etc., and examples of amphoteric surface active agents are those having anionic surface activity, e.g., imidazoline derivatives and betaine type compounds. The preferred concentration range of the anionic or amphoteric surface active agents is about 0.003% by weight to 3% by weight, preferably 0.06% by weight to 1% by weight. Specific examples of organic solvents which can be used are benzyl alcohol, propyl alcohol, etc. A suitable developing temperature can range from about 5° to 40° C., preferably 10° to 30° C., but this will of course depend on the developer concentration employed.

Since the present invention enables both positive-positive type copying and negative-positive type copying to be conducted using the same developer, the same apparatus and the same copying material, it is not necessary to change the copying material, the developer, the apparatus, etc. according to whether the original is a negative or positive, which is different from the conventional situation.

The present invention will now be illustrated in greater detail by the following non-limiting examples of preferred embodiments of the present invention. Unless otherwise indicated herein, all parts, percents, ratios and the like are by weight.

EXAMPLE 1

A light-sensitive solution, prepared by dissolving 1.5 parts by weight of polyhydroxyphenyl 1,2-naphthoquinonediazido-5-sulfonate (as described in Example 1 of U.S. Pat. No. 3,635,709), 1.5 parts by weight of a phenol-formaldehyde resin, 0.2 part by weight of tri-n-butylamine and 0.02 part by weight of a dye (Oil Blue made by Orient Chemical Co., Ltd.) in 25 parts by weight of ethyleneglycol monomethyl ether, was coated on a 0.3 mm-thick, grained aluminum plate using a rotary coater to prepare a light-sensitive plate having a light-sensitive layer of a coverage of about 2.0 g/m² on a dry basis.

The resulting light-sensitive plate was cut into two pieces, and one piece was imagewise exposed for 2 minutes through a positive original using light from a 30A carbon arc lamp as a light source positioned at a distance of 50 cm. When this piece was immersed in a 3% sodium silicate aqueous solution for 1 minute to conduct development, the exposed areas were dissolved away while the unexposed areas remained to provide a positive image in conformity with the original.

Then, the other remaining piece was imagewise exposed for 2 minutes through a negative original using light from a carbon arc lamp. After leaving this piece for 10 minutes at 100° C., the entire piece was exposed for 2 minutes using the above-described carbon arc lamp positioned at a distance of 50 cm as the light source. When this piece was immersed for 1 minute in a 3% sodium silicate aqueous solution to conduct development, the areas unexposed in the preceding negative image exposure were dissolved away to leave the exposed areas, thus forming a positive image.

The resulting two plate pieces provided good results as an offset printing plate.

EXAMPLE 2

3 parts by weight of polyhydroxyphenyl 1,2-naphthoquinone-diazido-5-sulfonate, as described in Example 1, and 0.3 part by weight of N-methylethanolamine were dissolved in 25 parts by weight of ethyleneglycol monomethyl ether. A light-sensitive plate containing a grained aluminum plate as a support was prepared in the same manner as in Example 1 using this light-sensitive solution. The resulting light-sensitive plate was cut into two pieces. One piece was exposed for 3 minutes through a positive original using light from a 2 KW metal halide lamp positioned at a distance of 1 m as a light source. When this piece was immersed for 1 minute in a 3% sodium silicate aqueous solution to conduct development, the exposed areas were dissolved away to provide a positive image.

Then, the other remaining piece was exposed for 3 minutes using a negative original and, after heating for 15 minutes at 100° C., subjected to overall exposure for 3 minutes using light from the same light source. When the piece was immersed in a 3% sodium silicate aqueous solution to conduct development, areas unexposed in the preceding negative imagewise exposure were dissolved away to provide a positive image.

The resulting two pieces were good as an offset printing plate as in Example 1.

EXAMPLE 3

In a manner analogous to Example 2 except for using 0.3 part by weight of diethylaniline in place of the 0.3 part by weight of N-methylethanolamine, the same results as in Example 3 were obtained.

EXAMPLE 4

In a manner analogous to Example 2 except for using 0.25 part by weight of hexamethylenetetramine in place of the 0.3 part by weight of N-methylethanolamine, the same results as in Example 2 were obtained.

EXAMPLE 5

1 part by weight of polyhydroxyphenyl 1,2-naphthoquinone-diazido-5-sulfonate as described in Example , 2 parts by weight of a cresol-formaldehyde resin, 0.2 part by weight of tri-iso-amylamine and 0.06 part by weight of a dye (Oil Blue) were dissolved in 20 parts by weight of ethyleneglycol monomethyl ether. This light-sensitive solution was coated on a 0.1 mm-thick transparent polyester sheet. This sheet was cut into two pieces. One piece was imagewise exposed for 40 seconds through a positive original using as a light source a 2 KW metal halide lamp positioned at a distance of 1 m. When this was immersed for 1 minute in a 5% sodium silicate aqueous solution to conduct development, the exposed areas were dissolved away to provide a bluish green transparent positive image.

Then, the other remaining piece was exposed for 40 seconds through a negative original using light from the same light source, followed by heating for 10 minutes at 100° C. When this was exposed overall for 40 seconds using light from the same light source and immersed for 2 minutes in a 5% sodium silicate aqueous solution to conduct development, areas unexposed in the preceding negative imagewise exposure were dissolved away to provide a blue positive image.

Each of the resulting two sheet pieces could be used as an original for projection.

EXAMPLE 6

1.5 parts by weight of 1,2-naphthoquinonediazido-5-sulfonic acid ester of bisphenol A, 1.5 parts by weight of a cresol-formaldehyde resin, 0.02 part by weight of a dye (Oil Blue) and 0.3 part by weight of N-methyldiethanolamine were dissolved in 20 parts by weight of dimethylformamide and coated on a grained aluminum plate, followed by drying. This was cut into two pieces. One piece was imagewise exposed for 1 minute through a positive original using as a light source a 2 KW metal halide lamp positioned at a distance of 1 m, followed by development-processing in a 5% sodium silicate aqueous solution to dissolve away the exposed areas. Thus, a positive image was obtained.

The other piece was also exposed for 1 minute using a negative image, followed by heating for 15 minutes at 100° C. When this piece was exposed overall and development-processed with a 5% sodium silicate aqueous solution, areas unexposed in the preceding negative imagewise exposure were dissolved away to provide a positive image.

While the invention has been described in detail and with reference to specific embodiments thereof, it will be apparent to one skilled in the art that various changes and modifications can be made therein without departing from the spirit and scope thereof.

What is claimed is:

1. A composition for a light-sensitive copying layer consisting essentially of an admixture of distinct compounds selected from a), b) and c) below:
   (a) an o-quinonediazide compound which has at least one o-quinonediazide group which undergoes an increase in solubility in alkaline solution upon irradiation with active light;
   (b) a resin selected from the group consisting of a phenol-formaldehyde resin, a cresol-formaldehyde resin, a styrene-maleic anhydride copolymer or a methacrylic acid-methylmethacrylate copolymer; and
   (c) at least one of a secondary or a tertiary aliphatic, hydroxy aliphatic or aromatic amine or hexamethylene-tetramine having a boiling point of not less than about 200° C., wherein said aliphatic amine is tributylamine or triamylamine, said hydroxy aliphatic amine is diethanolamine, N-methylethanolamine, N-methylidiethanolamine, dipropanolamine, or triethanolamine and wherein said aromatic amine is diethylaniline, wherein the proportion of said amine c) to said o-quinonediazide compound a) ranges from about 0.005 to 1 part by weight, per part by weight fo said o-quinonediazide compound and wherein said composition when used as a supported light-sensitive layer is capable, after image-wise exposure to active light, of forming a positive or negative image in the same layer,
   said positive image being formed by processing with an alkaline developer and
   said negative image being formed by heating, subsequent to exposure of previously unexposed or all portions of the layer with active light followed by processing with an alkaline developer.

2. The composition for a light-sensitive copying layer of claim 1, wherein said o-quinonediazide compound is an o-quinonediazide sulfonic acid ester or an o-quinonediazide sulfonamide.

3. A light-sensitive copying material comprising a support having thereon a layer of the light-sensitive composition of claim 1.

4. The composition for a light-sensitive copying layer of claim 2, wherein said o-quinone diazide compound is selected from the group 2,2'-dihydroxydiphenyl-bis(-naphthoquinone-1,2-diazido-5-sulfonate), 2,2'4,4'-tetrahydroxydiphenyl-tetra(naphthoquinone-1,2-diazido-5-sulfonate), 2,3,4,-trihydroxybenzophenone-bis(naphthoquinone-1,2-diazido-5-sulfonate), polyhydroxyphenyl naphthoquinone-1,2-diazido-5-sulfonate and the 1,2-naphthoquinone diazido-5-sulfonic acid ester of bisphenol A.

5. The composition for a light-sensitive copying layer of claim 1, wherein the proportion of said amine to said o-quinonediazide compound ranges from 0.01 to 0.3 parts by weight, per part by weight of said o-quinonediazide compound.

* * * * *